United States Patent
Miyake et al.

(10) Patent No.: US 7,332,804 B2
(45) Date of Patent: Feb. 19, 2008

(54) SEMICONDUCTOR DEVICE AND METHOD OF MANUFACTURING THE SAME

(75) Inventors: Eitaro Miyake, Hyogo-ken (JP); Yoshihiko Tojo, Fukuoka-ken (JP); Osamu Usuda, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/167,169

(22) Filed: Jun. 28, 2005

(65) Prior Publication Data

US 2005/0285240 A1    Dec. 29, 2005

(30) Foreign Application Priority Data

Jun. 28, 2004 (JP) ............................ 2004-189043
Jun. 21, 2005 (JP) ............................ 2005-180450

(51) Int. Cl.
*H01L 23/48* (2006.01)
*H01L 23/52* (2006.01)

(52) U.S. Cl. .............................. 257/692; 257/E23.031; 438/123; 438/124

(58) Field of Classification Search ................ 257/690, 257/692, 696, 693, 666, 672, 674–676, 718, 257/E23.031; 438/123, 124, 15
See application file for complete search history.

(56) References Cited

U.S. PATENT DOCUMENTS 5,345,106 A * 9/1994 Doering et al. ............. 257/675
5,708,293 A    1/1998 Ochi et al.
2004/0150077 A1    8/2004 Fujita

FOREIGN PATENT DOCUMENTS

| JP | 3-129870 | 6/1991 |
| JP | 5-129505 | 5/1993 |
| JP | 2002-141453 | 5/2002 |

* cited by examiner

*Primary Examiner*—David Zarneke
*Assistant Examiner*—Jenny L. Wagner
(74) *Attorney, Agent, or Firm*—Oblon, Spivak, McClelland, Maier & Neustadt, P.C.

(57) ABSTRACT

A semiconductor device and manufacturing the semiconductor device are described. There is provided a method of manufacturing a semiconductor device including, disposing a lead frame inside an outer lead so as to couple between a coupling portion and a coupling acceptance portion, the lead frame including a chip mounting portion and the coupling acceptance portion, the outer lead including a frame portion with outer terminal portions and the coupling portion, disposing a semiconductor chip on the chip mounting portion, connecting between the outer terminal portions and the semiconductor chip with a plurality of wires or leads, sealing the outer terminal portion, the lead frame disposed the semiconductor chip on and the wires or the leads by a mold resin, cutting off the outer terminal portions from the outer lead, and uncoupling the coupling portion from the coupling acceptance portion.

9 Claims, 9 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2004-189043, filed on Jun. 28, 2004 and No. 2005-180450, filed on Jun. 21, 2005, the entire contents of which are incorporated herein by reference.

FIELD OF THE INVENTION

The present invention relates to a semiconductor device including a semiconductor chip disposed on a lead frame and manufacturing the semiconductor device.

DESCRIPTION OF THE BACKGROUND

A lead frame on which is disposed a semiconductor chip is made of a comparatively thick material so as to have superior heat dissipation. On the other hand, an outer lead portion is made of a comparatively thin material so as to have superior molding performance. Because the outer lead supports the lead frame in process steps of manufacturing a semiconductor chip and a part of the outer lead is used as outer terminals for the semiconductor chip.

Utilizing a plurality of materials, each of the materials having different thickness, in the fabrication process steps presents increasing a number of the process steps and higher process cost. Therefore, the lead frame and the outer lead are individually formed, and the lead frame and the outer lead are subsequently coupled.

As shown in FIG. 9A, a lead frame 66 is arranged inside an outer lead 60 in process steps of manufacturing a semiconductor chip. In this process steps, coupling portions 63, 64 of the outer lead 60 and coupling acceptance portions 68, 69 of the lead frame 66 are mutually coupled. FIG. 9A also shows sending holes 61a, a frame portion 61, outer portions 62, terminal extension portions 65, and a chip mounting portion 67.

FIGS. 9B, C are cross-sectional views showing a coupling shape along the Y-Y direction in FIG. 9A. As shown in FIG. 9B, a coupling portion 64 is coupled with a coupling acceptance portion 69 by welding so as to form a welding portion 70. For another example, Japanese Patent Publication (Kokai) No. 2002-141453 discloses that a coupling portion 64a is coupled with a coupling acceptance portion 69a by caulking so as to form a caulking portion 71 as shown in FIG. 9C.

Welding or caulking can comparatively firmly couple between the outer lead 60 and the lead frame 66. On the other hand, the semiconductor chip is disposed on the chip mounting portion 67 of the lead frame 66 in process steps of manufacturing semiconductor device. The semiconductor chip and outer terminals 62 are connected by wire bonding, and are sealed by a mold resin. Subsequently, a terminal extension portion 65 and the coupling portions 63, 64 are cut off.

Stress generated by welding or caulking may cause mechanical damage in the lead frame 66 in a cutting step of a coupling portion. Therefore, a yield in fabrication steps of the semiconductor device may be decreased.

Using the welding tool or the caulking tool in the coupling steps presents comparatively longer process steps. Moreover, a fabrication cost is increased by investment in facilities.

SUMMARY OF THE INVENTION

According to an aspect of the invention, there is provided a method of manufacturing a semiconductor device including, arranging a lead frame inside an outer lead so as to couple between a coupling portion and a coupling acceptance portion, the lead frame including a chip mounting portion and the coupling acceptance portion, the outer lead including a frame portion with outer terminal portions and the coupling portion, disposing a semiconductor chip on the chip mounting portion, connecting between the outer terminal portions and the semiconductor chip with a plurality of wires or leads, sealing the outer terminal portion, the lead frame on which is disposed the semiconductor chip and the plurality of wires or the leads by a mold resin, cutting off the outer terminal portions from the outer lead, and uncoupling the coupling portion from the coupling acceptance portion.

Further, another aspect of the invention, there is provided a semiconductor device including, a lead frame including a chip mounting portion and a coupling acceptance portion, wherein the coupling acceptance portion has a function to be coupled to and to be decoupled to a coupling portion of an outer lead arranged around the lead frame, a semiconductor chip disposed on the chip mounting portion, a plurality of outer terminal portions cut off from an outer lead, a plurality of wires or leads connecting between the semiconductor chip and the plurality of outer terminal portions, and a mold resin sealing the lead frame on which is disposed the semiconductor chip, the plurality of outer terminal portions and the plurality of wires or leads.

DETAILED DESCRIPTION OF THE INVENTION

Embodiments of the present invention will be described hereinafter in detail with reference to the drawings mentioned above.

First, according to a first embodiment of the present invention, a method of manufacturing a semiconductor device in order of process steps is explained with reference to FIGS. 1-4. Moreover, FIGS. 4A and 4B are a plane view and a cross-sectional view, respectively, showing the semiconductor device in the first embodiment of the present invention.

Figure 1A:
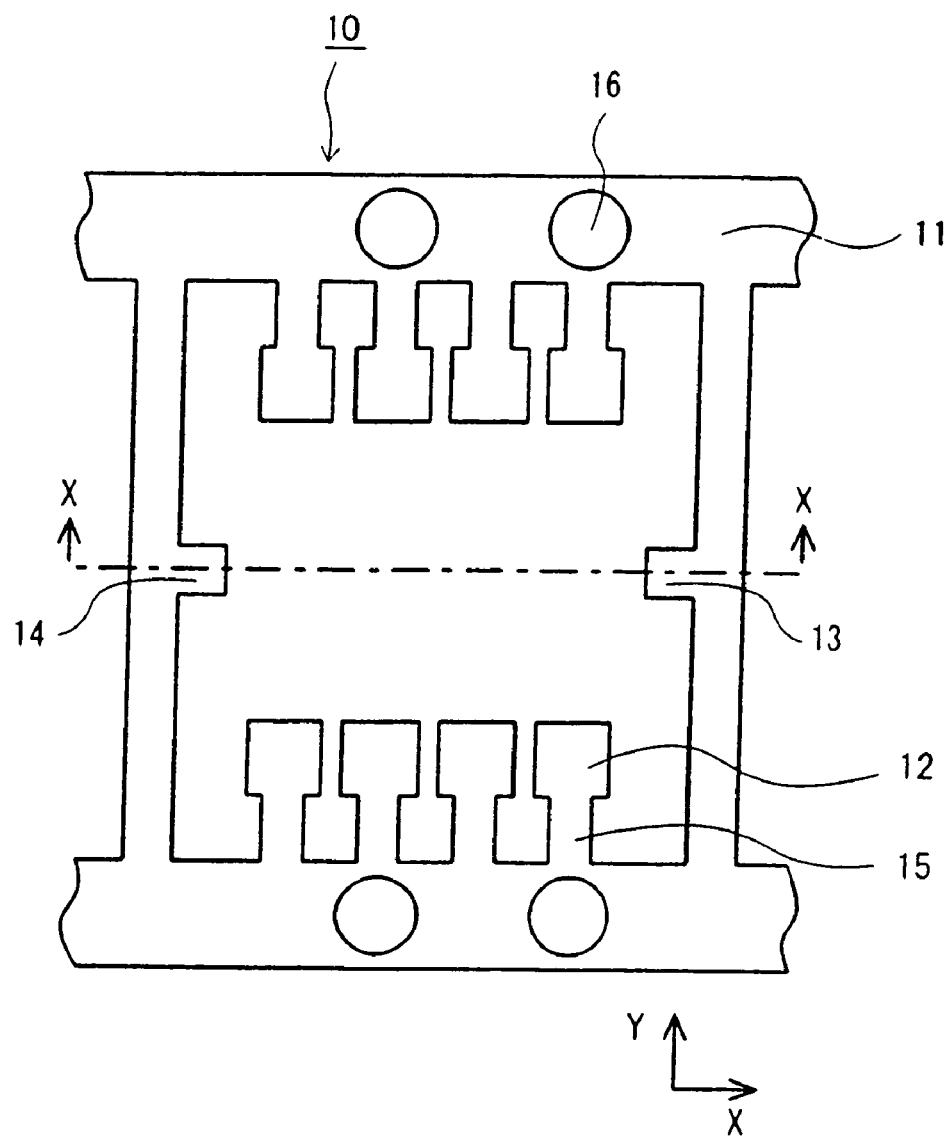
FIGS. 1A and 1B are a plan view and a cross-sectional view of an outer lead, respectively, showing a fabrication method of a semiconductor device in a first embodiment of the present invention.

FIG. 1A is a plan view showing an outer lead used in a process manufacturing the semiconductor device. An outer lead 10 is made of copper, for example. A frame portion 11 is arranged around the periphery of the outer lead 10. A lead frame is disposed inside the outer lead 10, as mentioned later. The outer lead 10 is continuously extended so as to dispose a plurality of lead frames in. Moreover, the sending hole 16 is formed in the frame portion 11 so as to send the outer lead 10 by a prescribe pitch in process steps of manufacturing semiconductor device.

Outer terminal portions 12 are extended from a terminal extension portion 15 into an inner region of the outer lead 10. In this embodiment, four outer terminal portions 12 are arranged in the one side of the outer lead 10 and each of the outer terminal portions 12 in this side is opposed to each of the outer terminal portions 12 in the other side, respectively.

A coupling portion 13, 14 are opposed to each other and are extended from the frame portion 11 normal to the direction which the outer terminal portions 12 are opposed to each other.

Figure 1B:
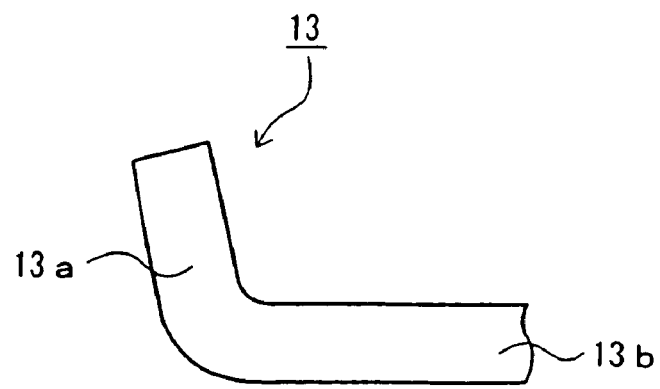

FIG. 1B is a cross-sectional view of the coupling portion along the line X-X in FIG. 1A. A coupling portion 13 includes a flat portion 13b and a bent portion 13a extended from the flat portion 13b. As described later, the bent portion 13a is coupled to the lead frame. Thickness of the outer lead 10 is comparatively thin to correspond to mechanical processing such as coupling to the lead frame. In this embodiment, the thickness of the outer lead 10 is nearly 0.4 mm, for example.

Figure 2A:
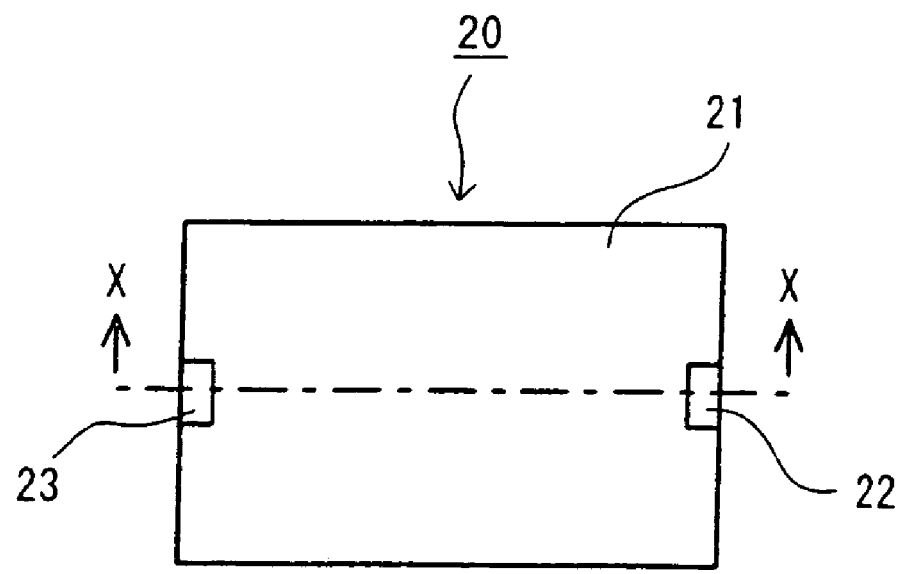
FIGS. 2A and 2B are a plan view and a cross-sectional view of a lead frame, respectively, showing the fabrication method of the semiconductor device in the first embodiment of the present invention.

FIG. 2A is a plan view showing a lead frame arranged inside the outer lead. A lead frame 20 is made of copper, for example. The lead frame 20 includes a chip mounting portion 21 on which is disposed the semiconductor chip and coupling acceptance portions 22, 23 to which are coupled a coupling portion of the outer lead 10 in process steps of manufacturing the semiconductor device. As the chip mounting portion 21 is used as a heat sink, thickness of the chip mounting portion 21 is comparatively thick. In this embodiment, the thickness is nearly 0.4 mm, for example.

Figure 2B:
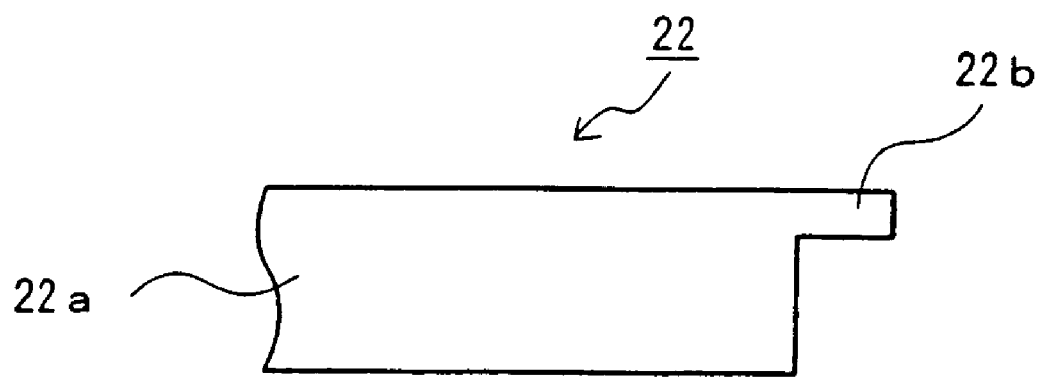

FIG. 2B is a cross-sectional view showing the coupling acceptance portion along the line X-X in FIG. 2(a). A coupling acceptance portion 22A includes a main portion 22a being comparatively thick and a bent acceptance portion 22b being comparatively thin extended thinly from the main portion 22a. The bent acceptance portion 22b acts as a stopper for the bent portion 13a.

Figure 3A:
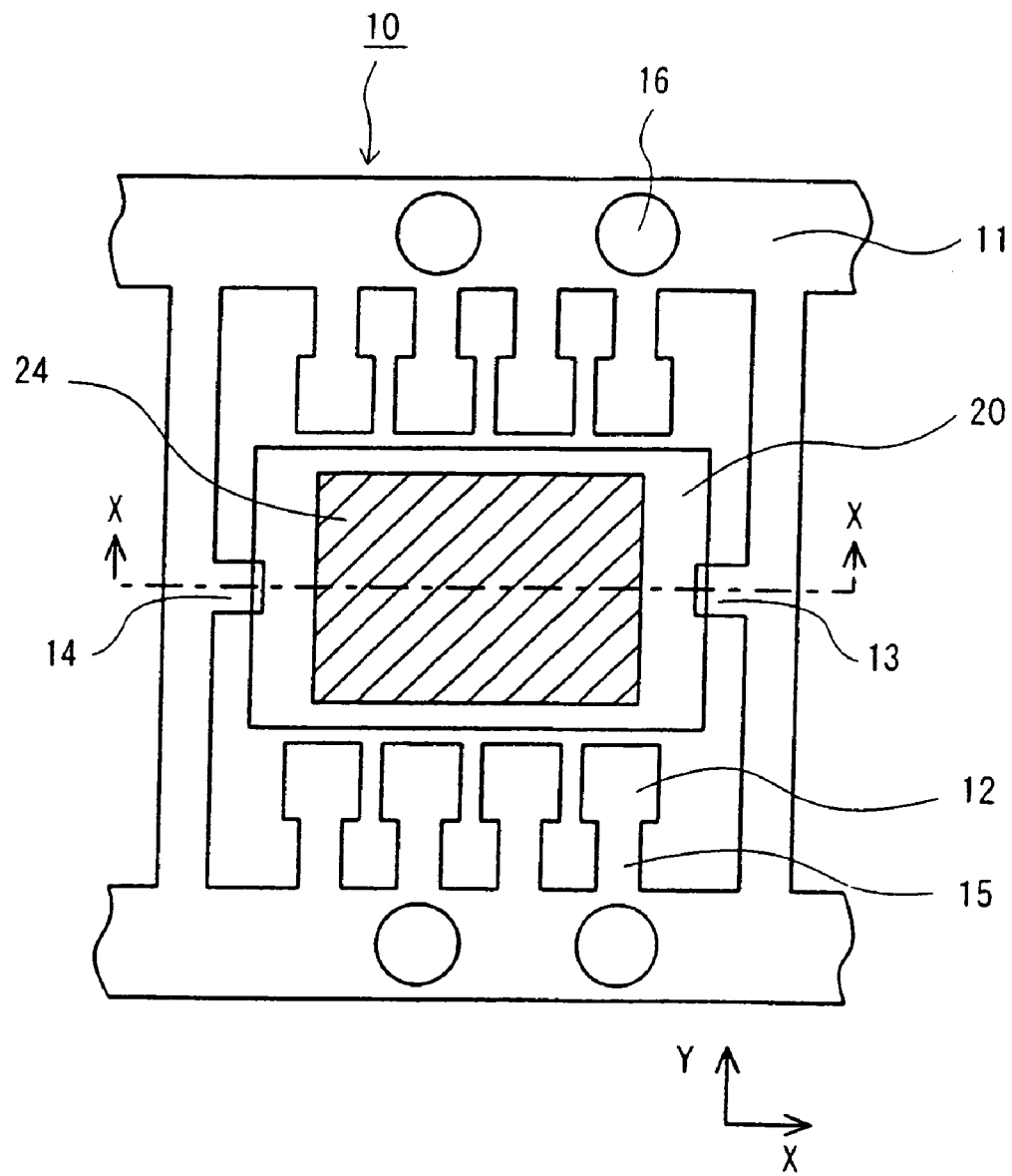
FIGS. 3A and 3B are a plan view of the outer lead and the lead frame, and a cross-sectional view of a coupling portion and a coupling acceptance portion for explaining coupling between the outer lead and the lead frame, respectively, showing the fabrication method of the semiconductor device in the first embodiment of the present invention.
Figure 4A:
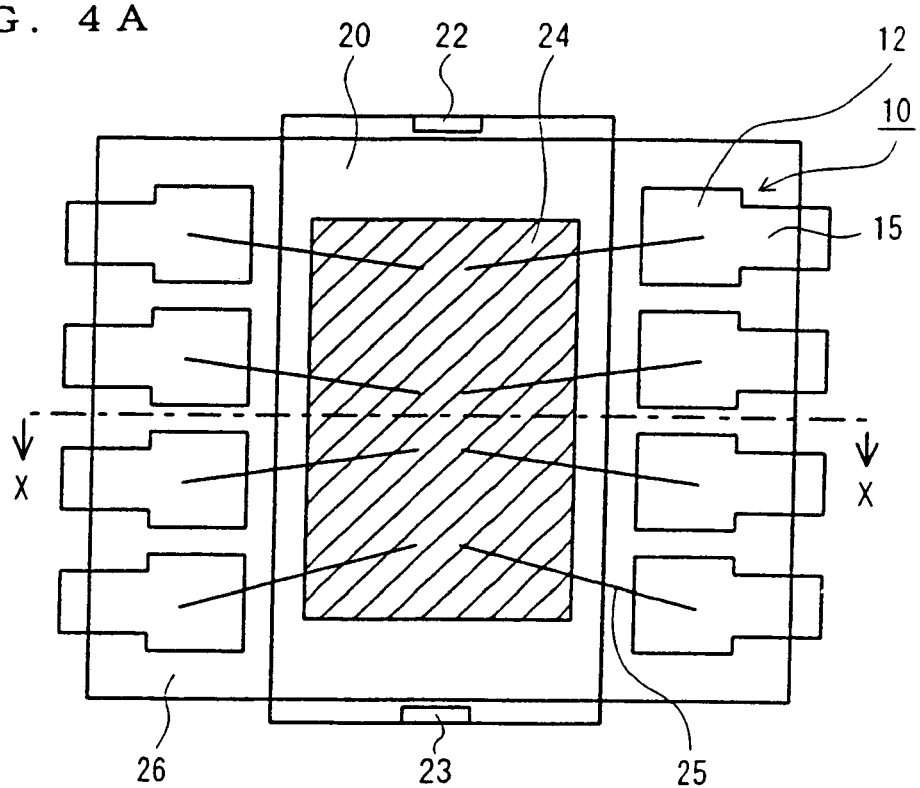
FIGS. 4A and 4B are a plan view and a cross-sectional view of the semiconductor device, respectively, showing the fabrication method of a semiconductor device in the first embodiment of the present invention.
Figure 4B:
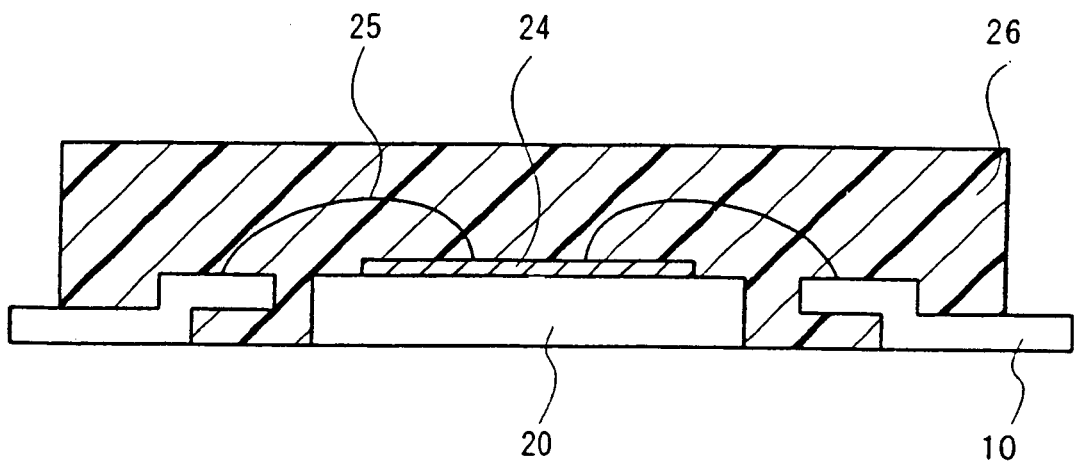

In process steps of manufacturing the semiconductor device of this embodiment, the lead frame 20 is arranged inside the outer lead 10, as shown in FIG. 3A. In this step, for example, the coupling portion 13 of the outer lead 10 is coupled to the coupling acceptance portion 22 of the lead frame 20 and the coupling portion 14 of the outer lead 10 is coupled to the coupling acceptance portion 23 of the lead frame 20.

Figure 3B:
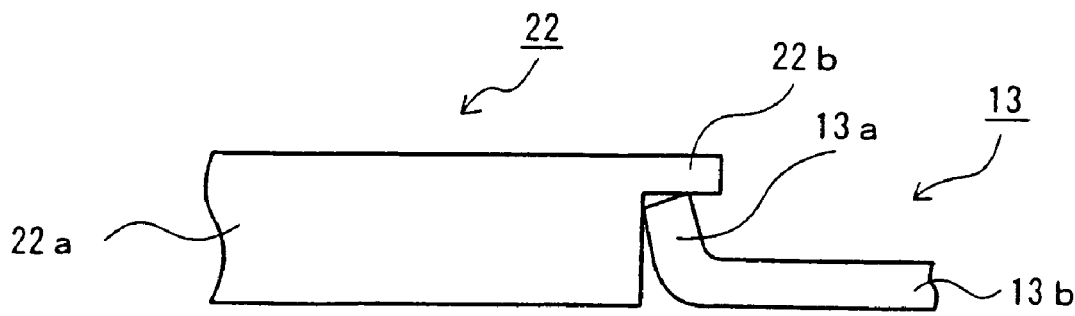

FIG. 3B is a cross-sectional view of the coupling between the coupling portion 13 and the coupling acceptance portion 22 along the line X-X in FIG. 3A. The bent portion 13a of the coupling portion 13 is stopped by the bent acceptance portion 22b of the coupling acceptance portion 22. The bent portion 13a has an angle to some extent; as a result, the lead frame 20 is retained by spring strength of the bent portion 13a.

A machine to couple between the lead frame and the outer lead is not required in this coupling step. On the other hand, conventional method using welding or caulking as coupling technique requires a welding tool or a caulking tool and results in longer process steps and increasing investment in facilities.

A semiconductor chip 24 is displaced on the chip mounting portion 21 and is adhered to. Gold wires 25, for example, are connected to pad portions (not illustrated) in the semiconductor chip 24 and the outer terminal portions 12 by using wire bonding technique, as shown in FIG. 4A. Furthermore, the semiconductor chip 24 is sealed by a mold resin 26. Leads as well as wires can be utilized for the connection member in this connection step.

After the semiconductor chip 24 is sealed, the terminal extension portion 15 is cut off. The outer terminal portions 12 are separated from the outer lead 10. On the contrary, the coupling portions 13, 14 of the outer lead 10 are removed from the coupling acceptance portion 22 of the lead frame 20. In the conventional method, the coupling portion in the lead frame is connected by welding or caulking therefore this portion is essentially cut out by a cutting tool. However, in this embodiment the coupling portion is merely separated without cutting so as to complete the semiconductor device as shown in FIG. 4B which is a cross-sectional view along X-X direction in FIG. 4A.

In this embodiment, the bent portion having spring function couples between outer lead and the lead frame by the spring function. The mold resin-sealing semiconductor device is separated from the outer lead by removing the bent portion without mechanically cutting. As a result, damage generation in the semiconductor device by mechanically cutting is prevented. This technique leads the semiconductor device to higher yield in processing and higher reliability in electrical performance.

Moreover, the outer lead and the lead frame are coupled by spring function, removing between the outer lead and the lead frame can be probable.

Increase of cost by machine investment such as a welding tool or a caulking tool can be prevented, as a result, comparatively cheaper semiconductor devices can be provided.

A second embodiment of the present invention is different from the first embodiment in a coupling acceptance of a semiconductor device. The second embodiment is characterized by a coupling acceptance portion without stopper function to a coupling portion. On the other hand, a coupling portion of an outer lead is the same structure as the first embodiment.

Figure 5A:
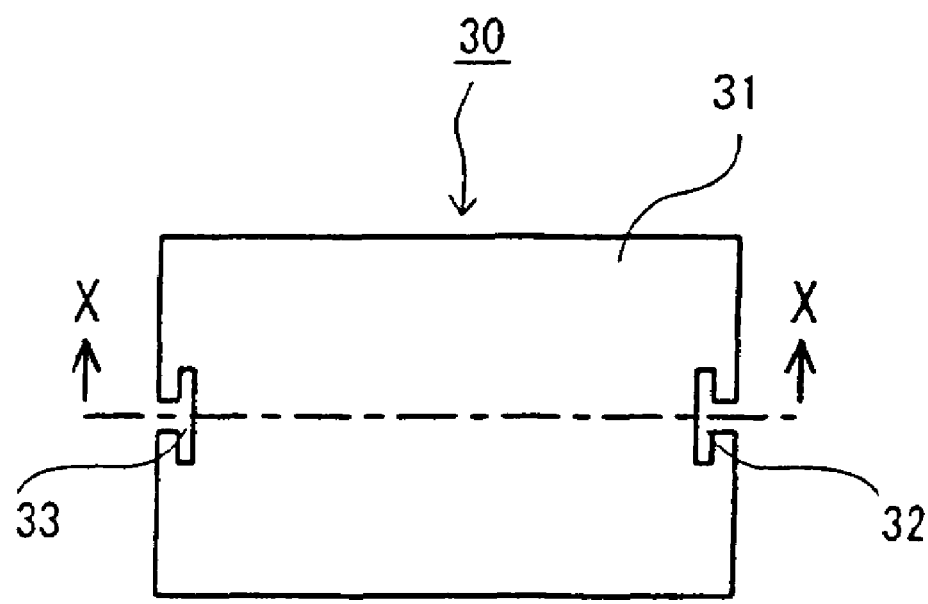
FIGS. 5A and 5B are a plan view of a lead frame and a cross-sectional view of a coupling acceptance portion, respectively, showing a fabrication method of a semiconductor device in a second embodiment of the present invention.
Figure 5B:
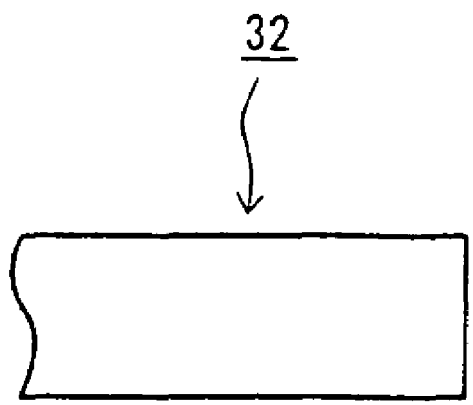

FIGS. 5A and 5B are a plane view and a cross-sectional view, respectively, showing a lead frame of the semiconductor device in the second embodiment of the present invention. A lead frame 30 arranged inside outer frame (not illustrated) is made of copper, for example. The lead frame 30 includes a chip mounting portion 31 on which is disposed the semiconductor chip and coupling acceptance portions 32, 33 to which is coupled a coupling portion of the outer lead in process steps of manufacturing semiconductor device.

As the chip mounting portion 31 is used as a heat sink, thickness of the chip mounting portion 31 is comparatively thick. In this embodiment, the thickness is nearly 1.5 mm, for example. On the other hand, thickness of the outer lead is comparatively thin. In this embodiment, the thickness is nearly 0.4 mm, for example.

The coupling acceptance portion 32, 33 have a bracket shape in which the coupling portion of the outer lead (not illustrated) is inserted so as to couple each other. FIG. 5B is a part of cross-sectional view along the X-X direction in FIG. 5A. As the coupling acceptance portion 32, 33 have uniformly a thickness, mechanical processing on the coupling acceptance portion 32, 33 is performed comparatively easily.

In addition, the outer lead et al. in this embodiment are basically the same as those in the first embodiment, explanations on the outer lead et al. are omitted. Moreover, a method of manufacturing the semiconductor device in this embodiment is the same as that in the first embodiment, an explanation on the method is also omitted.

As mentioned above, in this embodiment the mold resin-sealing semiconductor device is separated from the outer lead by removing without mechanically cutting as obtained in the first embodiment. Accordingly, damage generation in the semiconductor device by mechanically cutting is prevented. This technique leads the semiconductor device to higher yield in processing and higher reliability in electrical performance.

Increase of cost by machine investment such as a welding tool or a caulking tool can be prevented. As a result, comparatively cheaper semiconductor devices can be provided.

A third embodiment of the present invention is different from the first embodiment in a coupling acceptance of a semiconductor device. The third embodiment is characterized by a coupling acceptance portion without stopper function to a coupling portion. On the other hand, a coupling portion of an outer lead is the same structure as the first embodiment.

Figure 6A:
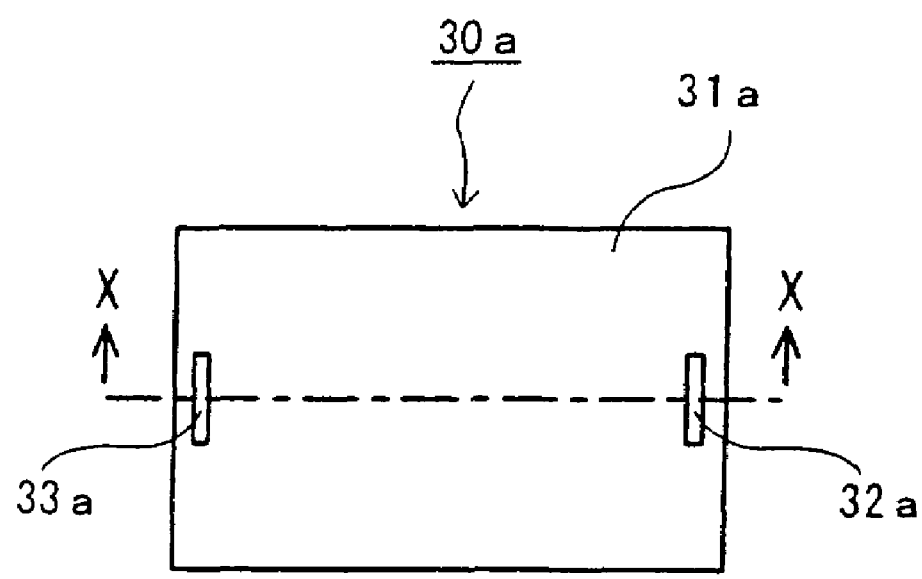
FIGS. 6A and 6B are a plan view of a lead frame and a cross-sectional view of a coupling acceptance portion, respectively, showing a fabrication method of a semiconductor device in a third embodiment of the present invention.
Figure 6B:
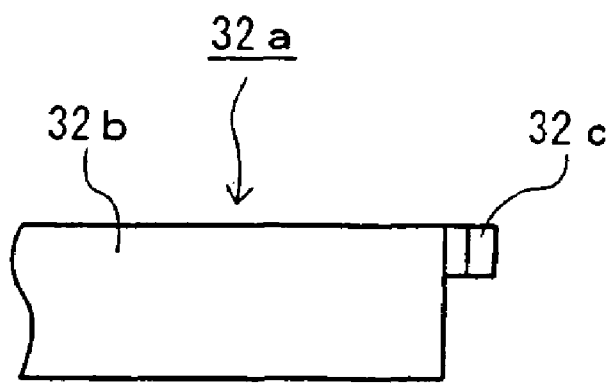

FIGS. 6A and 6B are a plane view and a cross-sectional view, respectively, showing a lead frame of the semiconductor device in the third embodiment of the present invention. A lead frame 30a arranged inside an outer frame (not illustrated) is made of copper, for example. The lead frame 30a includes a chip mounting portion 31a on which is disposed the semiconductor chip and coupling acceptance portions 32a, 33a to which coupled a coupling portion of the outer lead in process steps of manufacturing semiconductor device.

As the chip mounting portion 31a is used as a heat sink, thickness of the chip mounting portion 31a is comparatively thick. In this embodiment, the thickness is nearly 1.5 mm, for example. On the other hand, thickness of the outer lead is comparatively thin. In this embodiment, the thickness is nearly 0.4 mm, for example.

The coupling acceptance portion 32a, 33a have a rectangular loop shape in which the coupling portion of the outer lead (not illustrated) is inserted so as to couple each other. FIG. 6B is a part of cross-sectional view along the X-X direction in FIG. 6A. A bent acceptance portion 32b being comparatively thin is extended from a main portion 32a being comparatively thick in the coupling acceptance portion 22.

In addition, the outer lead et al. in this embodiment are basically the same as those in the first embodiment, explanations on the outer lead et al. are omitted. Moreover, a method of manufacturing the semiconductor device in this embodiment is the same as that in first the embodiment, an explanation on the method is also omitted.

As mentioned above, in this embodiment the mold resin-sealing semiconductor device is separated from the outer lead by removing without mechanically cutting as obtained in the first embodiment. Accordingly, damage generation in the semiconductor device by mechanically cutting is prevented. This technique leads the semiconductor device to higher yield in processing and higher reliability in electrical performance. The rectangular loop shape of the coupling acceptance portion may provide higher reliability on coupling between the outer lead and the lead frame.

Increase of cost by machine investment such as a welding tool or a caulking tool can be prevented. As a result, comparatively cheaper semiconductor devices can be provided.

A fourth embodiment of the present invention is different from the first embodiment in a coupling acceptance of a lead frame in a semiconductor device. The fourth embodiment is characterized by a coupling acceptance portion having a shallow hook shape. On the hand, a coupling portion of an outer lead is the same structure as the first embodiment.

Figure 7A:
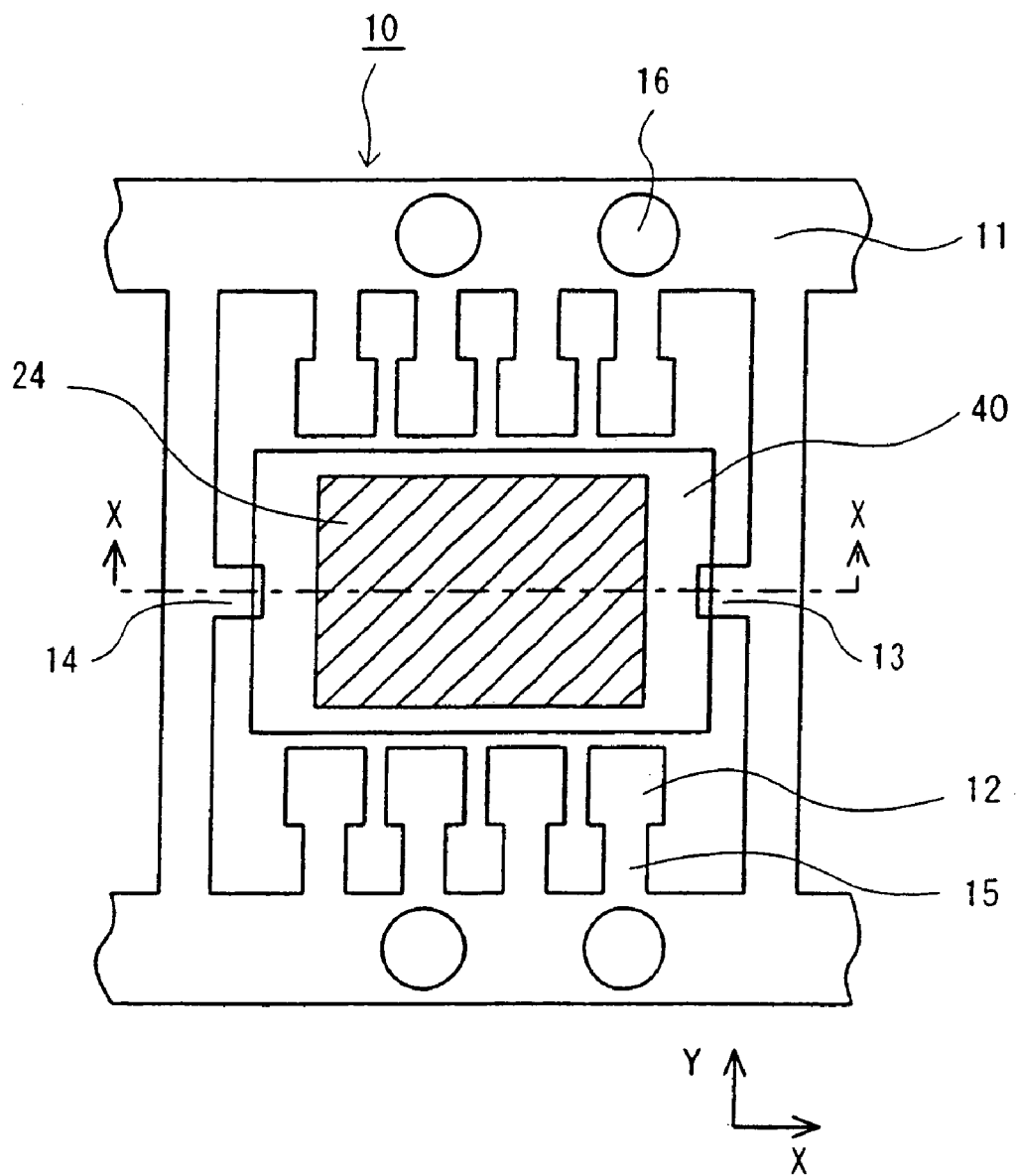
FIGS. 7A and 7B are a plan view of an outer lead and a lead frame, and a cross-sectional view of a coupling portion and a coupling acceptance portion for explaining coupling between the outer lead and the lead frame, respectively, showing a fabrication method of a semiconductor device in a fourth embodiment of the present invention.

FIG. 7A is a plane view showing a coupling state between the outer lead and the lead frame in the fourth embodiment of the present invention. A lead frame 40 is arranged inside the outer lead 10. For example, the coupling portions 13, 14 of the outer lead 10 are coupled to the coupling acceptance portion (not illustrated) of a lead frame 40.

Figure 7B:
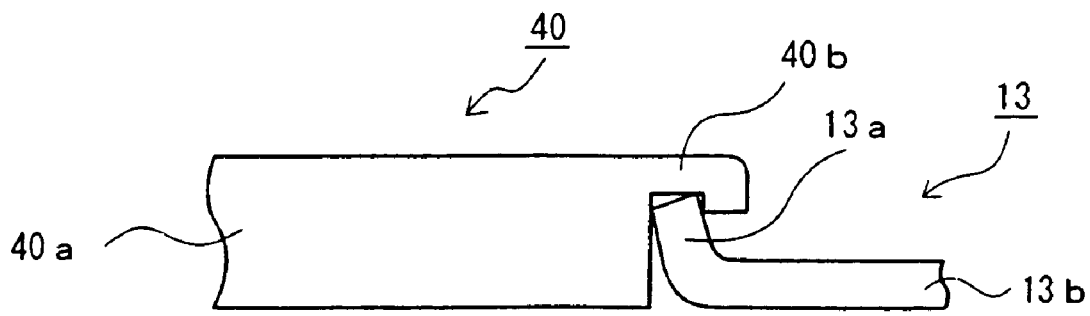

FIG. 7B is a part of a cross-sectional view showing the coupling state between the outer lead and the lead frame along the X-X direction in FIG. 7A. A bent portion 13a of the coupling portion 13 is stopped by a bent accept portion 40b being extended from a main portion 40a of a coupling acceptance portion 42. The bent portion 13a has an angle to some extent; as a result, the lead frame 40 is retained by spring strength of the bent portion 13a. Furthermore, a hook shape of the bent accept portion 40b provides coupling capability to the lead frame.

In addition, the outer lead et al. in this embodiment are basically the same as those in the first embodiment, explanations on the outer lead et al. are omitted. Moreover, a method of manufacturing the semiconductor device in this embodiment is the same as that in first the embodiment, an explanation on the method is also omitted.

As mentioned above, in this embodiment the mold resin-sealing semiconductor device is separated from the outer lead by removing without mechanically cutting as obtained in the first embodiment. Accordingly, damage generation in the semiconductor device by mechanically cutting is prevented. This technique leads the semiconductor device to higher yield in processing and higher reliability in electrical performance. The hook shape of the coupling acceptance portion may provide higher reliability on coupling between the outer lead and the lead frame.

Increase of cost by machine investment such as a welding tool or a caulking tool can be prevented, as a result, comparatively cheaper semiconductor devices can be provided.

A fifth embodiment of the present invention is characterized by a bent acceptance portion being in a side plane opposed to the bent portion.

Figure 8A:
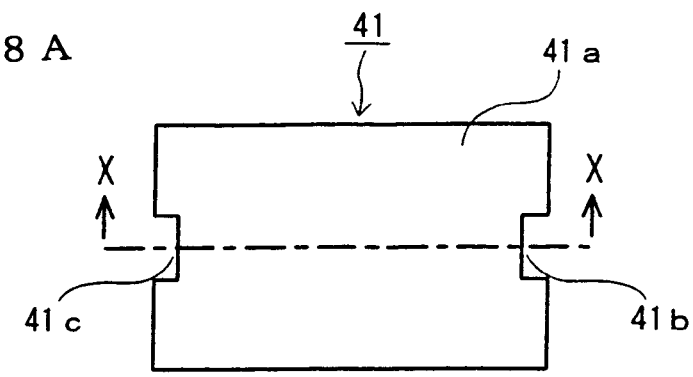
FIG. 8A is a plan view of a lead frame showing a semiconductor device in a fifth embodiment of the present invention.
Figure 8B:
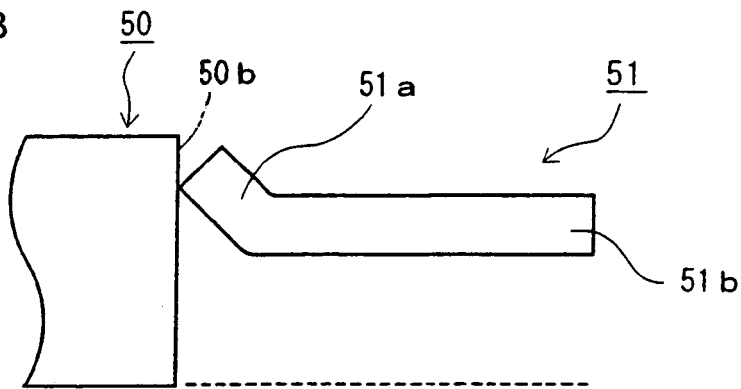
FIGS. 8B, 8C and 8D are cross-sectional views of coupling portions and coupling acceptance portions showing a semiconductor device in the fifth embodiment of the present invention.

FIG. 8A is a plane view showing a lead frame and FIG. 8B is a cross-sectional view showing a coupling state between a coupling portion of an outer lead and the coupling acceptance portion of the lead frame. A lead frame 41 includes a chip-mounting portion 41a and coupling acceptance portions 41b, 41c. The coupling acceptance portions 41b, 41c have no frame and stopper inserted the coupling portion. A bent portion 51a of a coupling portion 51 pushes the bent acceptance portion 50b of the coupling acceptance portion 50. Accordingly, the bent portion 51a acts as spring function so as to couple between the lead frame and the outer lead. Furthermore, the bottom surface of the flat portion 51b of the coupling portion 51 is in a position higher than the bottom surface of the coupling acceptance portion 50, the semiconductor chip is disposed comparatively easily on the chip mounting portion 41a. Moreover, the flat portion 51b has a stable structure in the disposing step.

The method of manufacturing the semiconductor device in this embodiment is basically the same as that in first the embodiment. Different point is to separate the coupling portion 51 of the outer lead from the coupling acceptance portion 50 of the lead frame by cutting off the coupling portion 51.

Figure 8C:
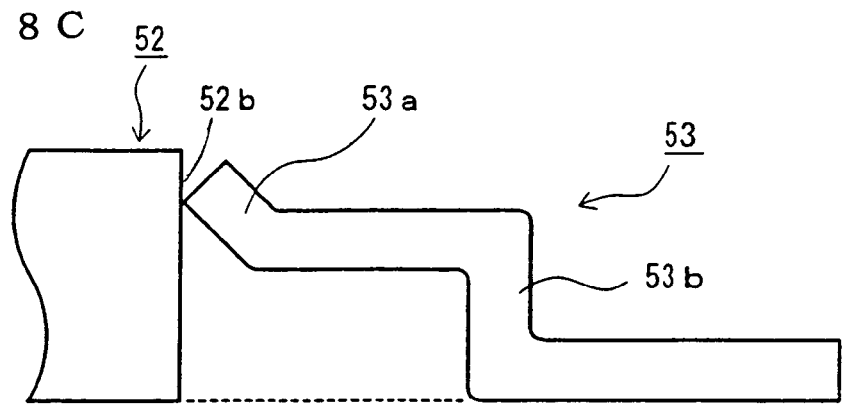
Figure 8D:
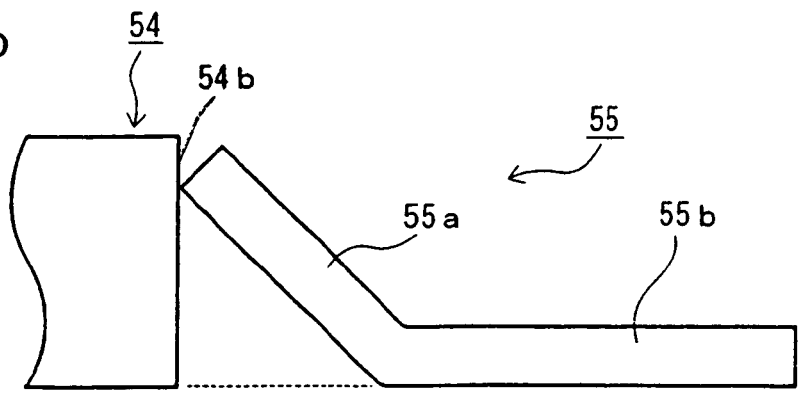
Figure 9A:
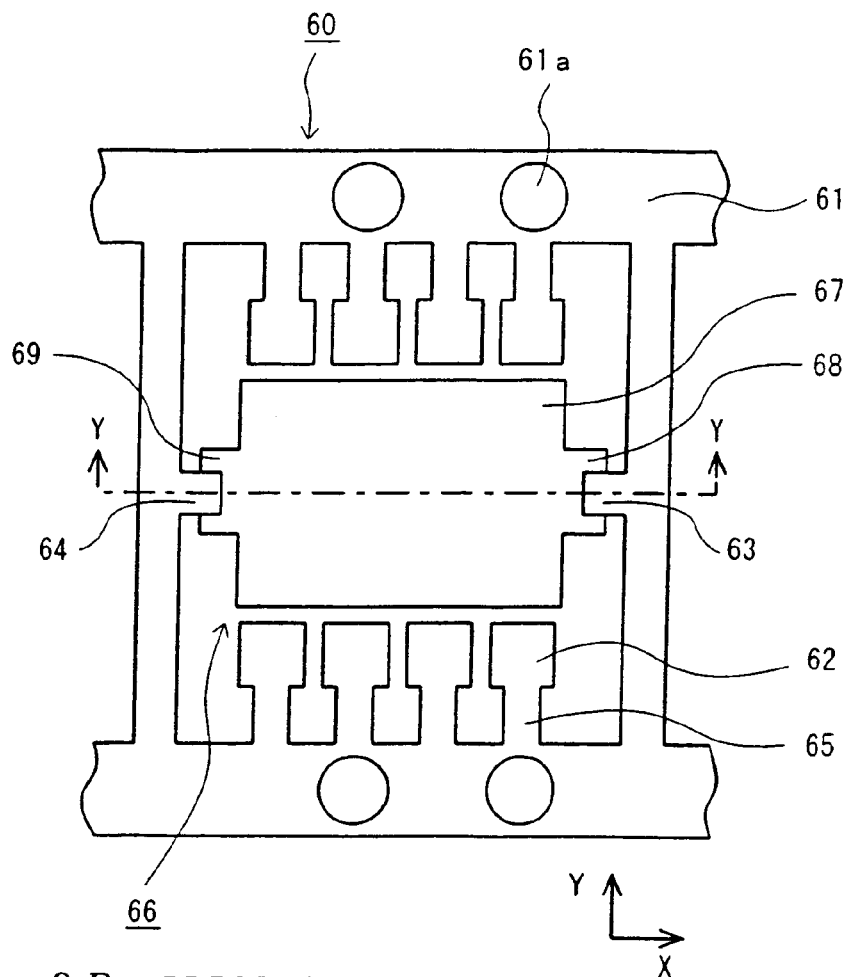
FIGS. 9A and 9B-9C are a plan view of an outer lead and a lead frame, and a cross-sectional view of a coupling portion between an outer lead and a lead frame, respectively, in a conventional semiconductor device.
Figure 9B:
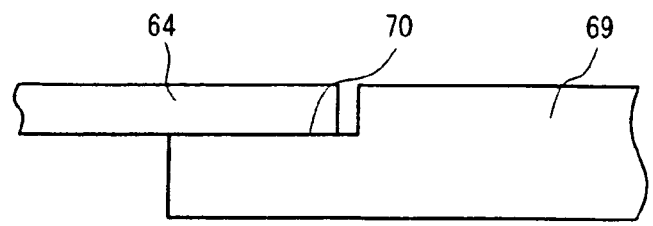
Figure 9C:
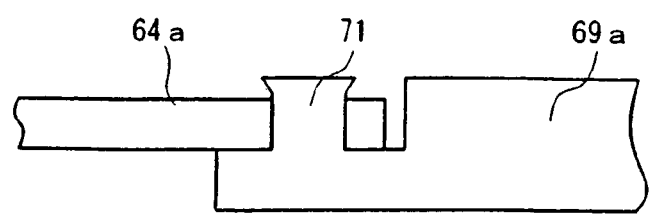

FIGS. 8C and 8D show modifications of the fifth embodiment in the present invention. FIG. 8C shows a bending structure on a flat portion 53b of the coupling portion 53 based on the coupling portion 51 as shown in FIG. 8B. As the bottom surface of the outer lead is the same as the bottom surface of the lead frame in a plane, the bending structure becomes much flexible for operating a bent portion 53a. FIG. 8D shows a structure on a flat portion 55b of the coupling portion 55. As the bottom surface of the outer lead has no bending structure and is the same as the bottom surface of the lead frame in a plane, the flat portion 55b has a stable structure in the disposing step.

As mentioned above, in this embodiment, damage generation in the semiconductor device by welding or caulking can be prevented in the separation between the coupling portion and the coupling acceptance portion.

Moreover, increase of cost by machine investment such as a welding tool or a caulking tool can be prevented, as a result, comparatively cheaper semiconductor devices can be provided.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, a shape and a bending angle of a bent portion or a structure of a coupling acceptance portion et al. can be modified unless it failed to couple between a lead frame and an outer lead. A shape, a structure and a material of a lead frame and an outer lead also can be modified by corresponding to specifications of a semiconductor chip on the lead frame.

What is claimed is:

1. A semiconductor device, comprising:
   a lead frame including a chip mounting portion and a coupling acceptance portion, wherein the coupling acceptance portion is configured to be removably coupled to and decoupled from a coupling portion of an outer lead arranged around the frame;
   a semiconductor chip disposed on the chip mounting portion;
   a plurality of outer terminal portions cut off from an outer lead;
   a plurality of wires or leads connecting between the semiconductor chip and the plurality of outer terminal portions; and
   a mold resin sealing the lead frame on which is disposed the semiconductor chip, the plurality of outer terminal portions and the plurality of wires or leads, wherein
   the coupling acceptance portion has a bent acceptance portion which is configured to be coupled to and decoupled from a bent portion extended from a flat portion of the coupling portion.

2. The semiconductor device according to claim 1, wherein the bent acceptance portion is configured to be coupled to the bent portion with a spring function.

3. The semiconductor device according to claim 2, wherein the bent acceptance portion is in a side wall opposed to the bent portion.

4. The semiconductor device according to claim 1, wherein bottom surface of the flat portion in the coupling portion is upper than a bottom surface of the chip mounting portion in the lead frame.

5. The semiconductor device according to claim 1, wherein a bottom surface of the flat portion is in the same plane as the bottom surface of the chip mounting portion.

6. The semiconductor device according to claim 1, wherein the flat portion has a bending structure and the bottom surface of the flat portion is in the same plane as the bottom surface of the chip mounting portion.

7. The semiconductor device according to claim 1, wherein the bent acceptance portion is a rectangular loop shape.

8. The semiconductor device according to claim 1, wherein the bent acceptance portion is a bracket shape.

9. The semiconductor device according to claim 1, wherein the bent acceptance portion is a hook shape.

* * * * *